(12) United States Patent
Yasuhira et al.

(10) Patent No.: US 10,798,860 B2
(45) Date of Patent: Oct. 6, 2020

(54) COMPONENT SUPPLY METHOD AND COMPONENT MOUNTING SYSTEM

(71) Applicant: Panasonic Intellectual Property Management Co., Ltd., Osaka (JP)

(72) Inventors: Nobuto Yasuhira, Hyogo (JP); Ryouji Eguchi, Yamanashi (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 571 days.

(21) Appl. No.: 15/364,508

(22) Filed: Nov. 30, 2016

(65) Prior Publication Data

US 2017/0164530 A1     Jun. 8, 2017

(30) Foreign Application Priority Data

Dec. 3, 2015   (JP) ................. 2015-236234

(51) Int. Cl.
*H05K 13/08*      (2006.01)
*H05K 13/04*      (2006.01)

(52) U.S. Cl.
CPC ....... *H05K 13/086* (2018.08); *H05K 13/0419* (2018.08)

(58) Field of Classification Search
CPC ........... H05K 13/0215; H05K 13/0417; H05K 13/0419; H05K 13/086; H05K 13/08; H05K 13/0895; H05K 13/021
See application file for complete search history.

(56) References Cited

U.S. PATENT DOCUMENTS

2013/0028701 A1*   1/2013   Sumi .................. H05K 13/0417
                                              414/806
2015/0223372 A1   8/2015   Kanai et al.

FOREIGN PATENT DOCUMENTS

JP        2014-027131 A     2/2014

* cited by examiner

*Primary Examiner* — Livius R. Cazan
(74) *Attorney, Agent, or Firm* — Pearne & Gordon LLP

(57) ABSTRACT

A component mounting system includes an automatic loading-type tape feeder (a component supply unit) being capable of supplying up to N (N is a natural number equal to or larger than 1) carrier tapes for storing a component, and automatically transporting an inserted carrier tape, and a component mounting apparatus which mounts the component supplied from the tape feeder on a substrate, in which a replenishing operation of carrier tape with respect to the tape feeder is detected, and a case where a carrier tape with which the tape feeder is to be replenished is an (N+1)-th is notified to an operator.

9 Claims, 13 Drawing Sheets

FIG. 8A

| COMPONENT DISPOSING DATA | | | | 52b |
|---|---|---|---|---|
| FEEDER ADDRESS | FEEDER ID | NUMBER OF TAPES | PRECEDING TAPE COMPONENT ID (1) | SUCCEEDING TAPE COMPONENT ID (2) |
| f1 | Faaaa | 2 | D1aaa | D2aaa |
| f2 | Fbbbb | 1 | D1bbb | — |
| f3 | Fcccc | 0 | — | — |
| ⋮ | | | | |
| 61 | 62 | 63 | 64(1) | 64(2) |

FIG. 8B

| FEEDER INFORMATION | 41a |
|---|---|
| PRECEDING TAPE COMPONENT ID (1) | SUCCEEDING TAPE COMPONENT ID (2) |
| D1aaa | D2aaa |
| 64(1) | 64(2) |

INSERT SUCCEEDING TAPE 16(2)

INSERT EXCESSIVE TAPE 16(3)

COMPONENT SUPPLY METHOD AND COMPONENT MOUNTING SYSTEM

BACKGROUND

1. Technical Field

The present disclosure relates to a component supply method in a component mounting system in which a tape feeder for pitch-feeding a carrier tape for storing a component is disposed and the component mounting system.

2. Description of the Related Art

In a component mounting apparatus by which a component is mounted on a substrate, a tape feeder is disposed as a component supply device. The tape feeder pitch-feeds a carrier tape holding a component such that the component is supplied to a component adsorption position by a mounting head of a component mounting mechanism. In recent years, in order to reduce the burden of a replenishing operation of the carrier tape by an operator, an automatic loading-type tape feeder which automatically loads and pitch-feeds the carrier tape has been developed (for example, refer to PTL 1).

In the tape feeder disclosed in PTL 1, when a leading end of the carrier tape is inserted into an insertion port provided in the tape feeder, the carrier tape is automatically loaded to the component adsorption position. At the time of replenishing the component during production, when the leading end of the carrier tape for replenishment (a succeeding tape) is further inserted into the insertion port in a state where the carrier tape (a preceding tape) during production is set therein, the succeeding tape is loaded to a predetermined position.

CITATION LIST

Patent Literature

PTL 1: Japanese Patent Unexamined Publication No. 2014-27131

SUMMARY

According to the disclosure, there is provided a component supply method in a component mounting system which includes a component supply unit for supplying up to N (N is a natural number equal to or larger than 1) carrier tapes for storing a component, and automatically transporting an inserted carrier tape, and a component mounting apparatus which mounts the component supplied from the component supply unit on a substrate, the method including detecting a replenishing operation of carrier tape with respect to the component supply unit, and notifying an operator of a case where a carrier tape with which the component supply unit is to be replenished is an (N+1)-th.

According to the disclosure, there is provided a component mounting system which includes a component supply unit being capable of supplying up to N (N is a natural number equal to or larger than 1) carrier tapes for storing a component, and automatically transporting an inserted carrier tape, and a component mounting apparatus which mounts the component supplied from the component supply unit on a substrate, the system including a detector for detecting a replenishing operation of carrier tape with respect to the component supply unit, a determiner for determining the number of carrier tape with which the component supply unit is to be replenished, and a notifier for notifying an operator of a case where the determiner determines that a carrier tape with which the component supply unit is to be replenished is an (N+1)-th.

BRIEF DESCRIPTION OF THE DRAWINGS

FIG. 8A is a configuration diagram of component disposing data used in the component mounting system of the embodiment of the present disclosure;

FIG. 8B is a configuration diagram of feeder information used in the component mounting system of the embodiment of the present disclosure;

DETAILED DESCRIPTION

Before describing embodiments of the present disclosure, a problem of the apparatus in the related art will be briefly described.

In the related art including Japanese Patent Unexamined Publication No. 2014-27131, there is a problem that a larger number of carrier tapes than the number of carrier tapes which are able to be supplied may be set by mistake. That is, an automatic loading-type tape feeder has a configuration in which a succeeding tape can be inserted into the insertion port so as to be supplied even in a state where a preceding tape protrudes from the insertion port, and thus there is a problem in that an excess carrier tape for replenishment may be inserted into the tape feeder in which the succeeding tape is already set.

Embodiments

Figure 2:
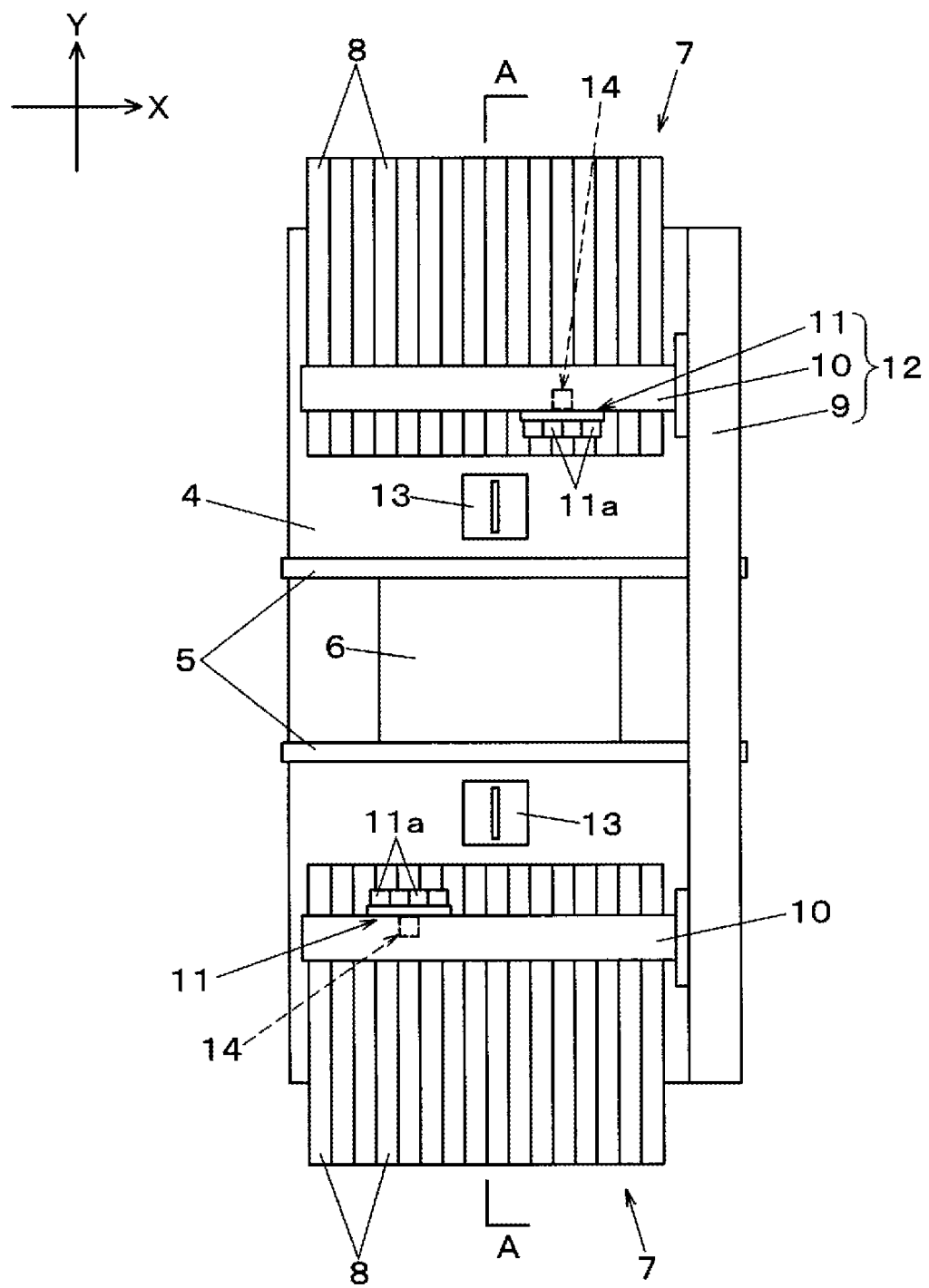
FIG. 2 is a top view of a component mounting apparatus of the embodiment of the present disclosure.
Figure 3:
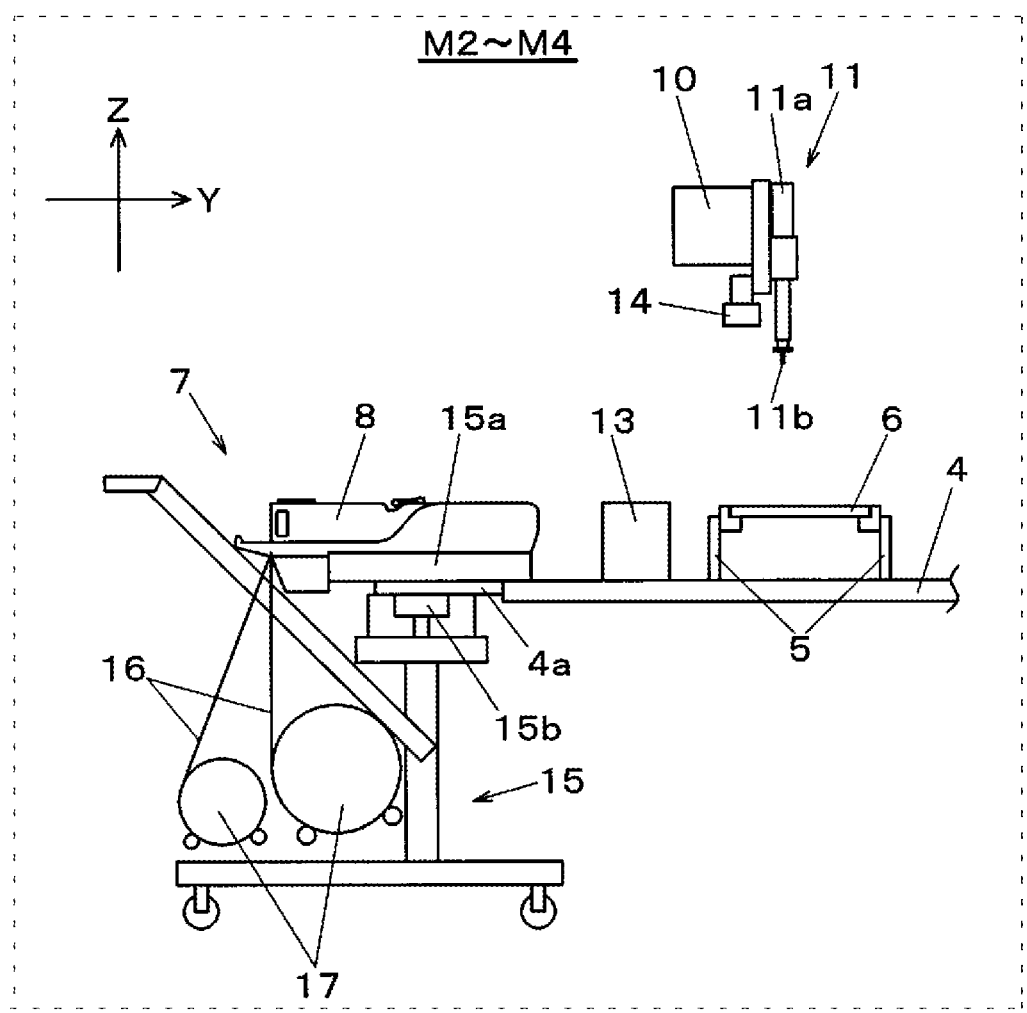
FIG. 3 is a partial sectional view of the component mounting apparatus of the embodiment of the present disclosure.

An embodiment of the present disclosure will be described below with reference to the drawings. Configurations, forms, and the like are merely an example, and thus can be appropriately changed in accordance with the specification of a component mounting system. In the following description, corresponding components are denoted by the same numerals in all of the drawings, and repeated description will be omitted. In FIG. 2 and some portions in the following description, an X direction (a horizontal direction in FIG. 2) which is orthogonal to a substrate transport direction, and a Y direction which is orthogonal to the substrate transport direction (a vertical direction in FIG. 2) are illustrated as two axial directions which are orthogonal to each other on a horizontal surface. In FIG. 3 and some portions in the following description, a Z direction is illustrated as a height direction which is orthogonal to the horizontal surface. The Z direction is a vertical direction or an orthogonal direction in a case where the component mounting system is installed on the horizontal surface.

Figure 1:
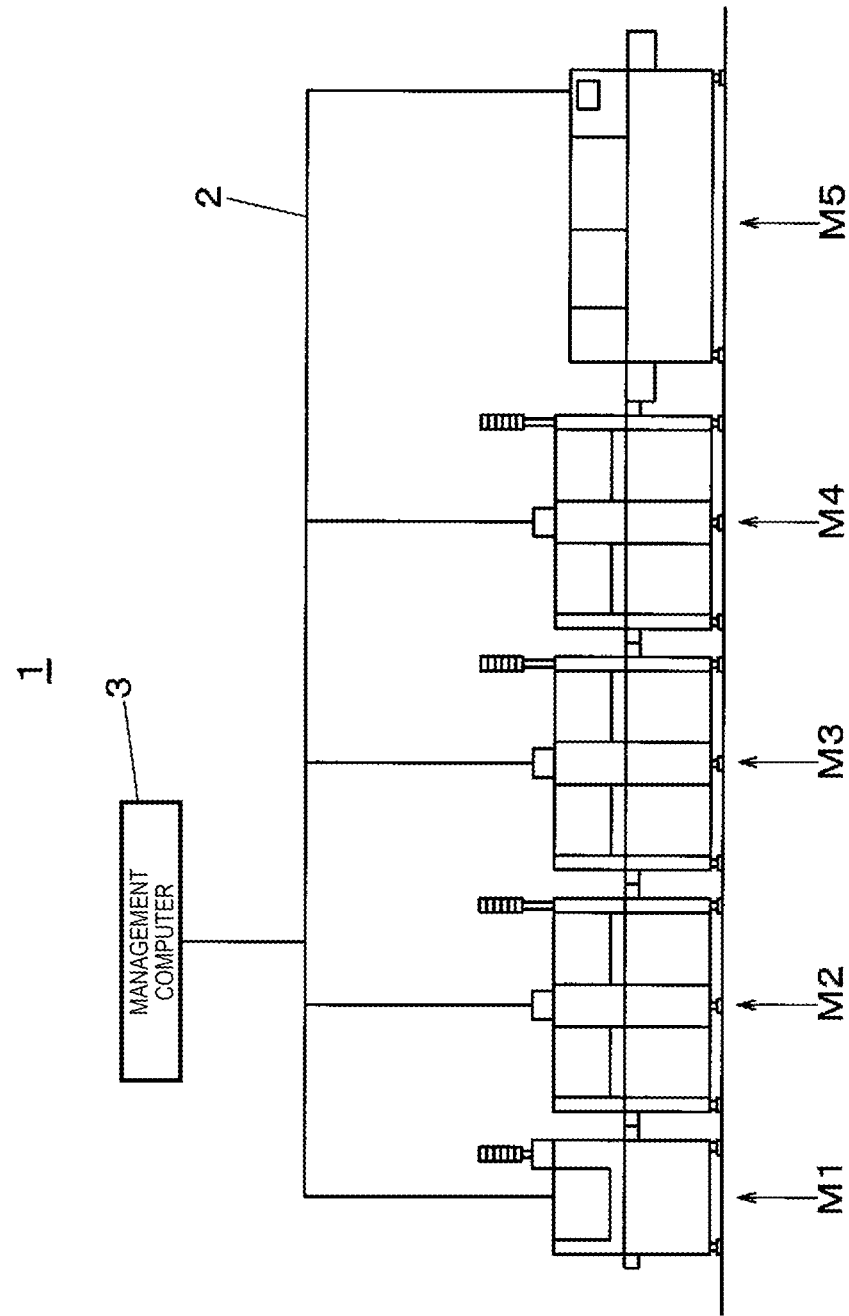
FIG. 1 is a configuration diagram of a component mounting system of an embodiment of the present disclosure.

First, a component mounting system will be described with reference to FIG. 1. In FIG. 1, component mounting system 1 has a configuration in which printing apparatus M1, component mounting apparatuses M2 to M4, and reflow apparatus M5 which are coupled to each other are connected to each other via communication network 2, and all of the apparatuses are controlled by management computer 3. Component mounting system 1 has a function of manufacturing a mounting substrate by mounting a component on a substrate.

Printing apparatus M1 screen-prints a paste solder to an electrode for bonding the component formed on the substrate. Component mounting apparatuses M2 to M4 perform a component mounting operation in which the component is extracted by a mounting head from a part feeder such as tape feeders which are arranged in a component supplier, and then is transported and mounted on the substrate. After that, the substrate on which the component is mounted is transported to reflow apparatus M5, and the component mounted on the substrate is solder-bonded on the substrate so as to manufacture a mounting substrate.

Next, configurations of component mounting apparatuses M2 to M4 will be described with reference to FIG. 2 and FIG. 3. FIG. 3 partially illustrates a cross-section taken along line A-A in FIG. 2. Component mounting apparatuses M2 to M4 have a function of mounting the component supplied from component supply unit on the substrate. In FIG. 2, substrate transport mechanism 5 is disposed in the center of table 4 in the X direction. Substrate transport mechanism 5 transports substrate 6 which is loaded from the upstream side such that substrate 6 is held by being positioned at a mounting stage set for a component mounting operation. Component suppliers 7 are disposed on both sides of substrate transport mechanism 5, and a plurality of tape feeders 8 are mounted in a line on each component supplier 7. Tape feeder 8 pitch-feeds the carrier tape storing the component in a tape-feeding direction so as to supply the component to a component adsorption position by a mounting head of a component mounting mechanism described below.

Y-axis moving table 9 which is provided with a linear driving mechanism is disposed at an end of one side of an upper surface of table 4 in the X direction. Two X-axis moving tables 10 which are provided with the linear driving mechanism as described above are movably attached to Y-axis moving table 9 in the Y direction. Mounting head 11 is movably mounted on each of two X-axis moving tables 10 in the X direction. Mounting head 11 is a multi-type head which is provided with a plurality of holding heads 11a, and suction nozzle 11b which is capable of individually lifting components by suctioning and holding the component is mounted at a lower end of each of holding head 11a, as illustrated in FIG. 3.

Mounting head 11 is moved in the X direction and the Y direction by driving Y-axis moving table 9 and X-axis moving table 10. With this, two mounting heads 11 extract the component from the component adsorption position of tape feeder 8 which is correspondingly disposed in component supplier 7 by suctioning and holding the component with suction nozzle 11b, and then transport and mount the component on a mounting place of substrate 6 which is positioned by substrate transport mechanism 5. Y-axis moving table 9, X-axis moving table 10, and mounting head 11 form component mounting mechanism 12 which transports and mounts the component on substrate 6 by moving mounting head 11 which holds the component.

Component recognition camera 13 is disposed between component supplier 7 and substrate transport mechanism 5. When mounting head 11 which extracts the component from component supplier 7 is moved above component recognition camera 13, component recognition camera 13 captures and recognizes the component in a state of being held in mounting head 11. Substrate recognition camera 14 which is moved integrally with mounting head 11 is mounted on a lower surface of X-axis moving table 10.

When mounting head 11 is moved, substrate recognition camera 14 is moved above substrate 6 which is positioned by substrate transport mechanism 5 so as to capture and recognize substrate 6. In the mounting operation in which the component is mounted on substrate 6 by mounting head 11, a mounting position is corrected based on the result of the component recognition by component recognition camera 13, and the result of the substrate recognition by substrate recognition camera 14.

As illustrated in FIG. 3, cart 15 in a state where the plurality of tape feeders 8 are mounted on feeder base 15a in advance is set to component supplier 7. A feeder address for specifying a feeder position at which each tape feeder 8 is mounted is set in feeder base 15a, and in the component mounting operation, each tape feeder 8 on feeder base 15a is specified via the feeder address.

The position of cart 15 is fixed to component supplier 7 by clamping feeder base 15*a* with respect to fixing base 4*a* which is provided on table 4 by clamp mechanism 15*b*. Supply reel 17 which stores carrier tape 16 holding the component in a state of being wound is held in cart 15. Carrier tape 16 drawn from supply reel 17 is pitch-fed by tape feeder 8 to the position in which the component is adsorbed by suction nozzle 11*b*.

Figure 4:
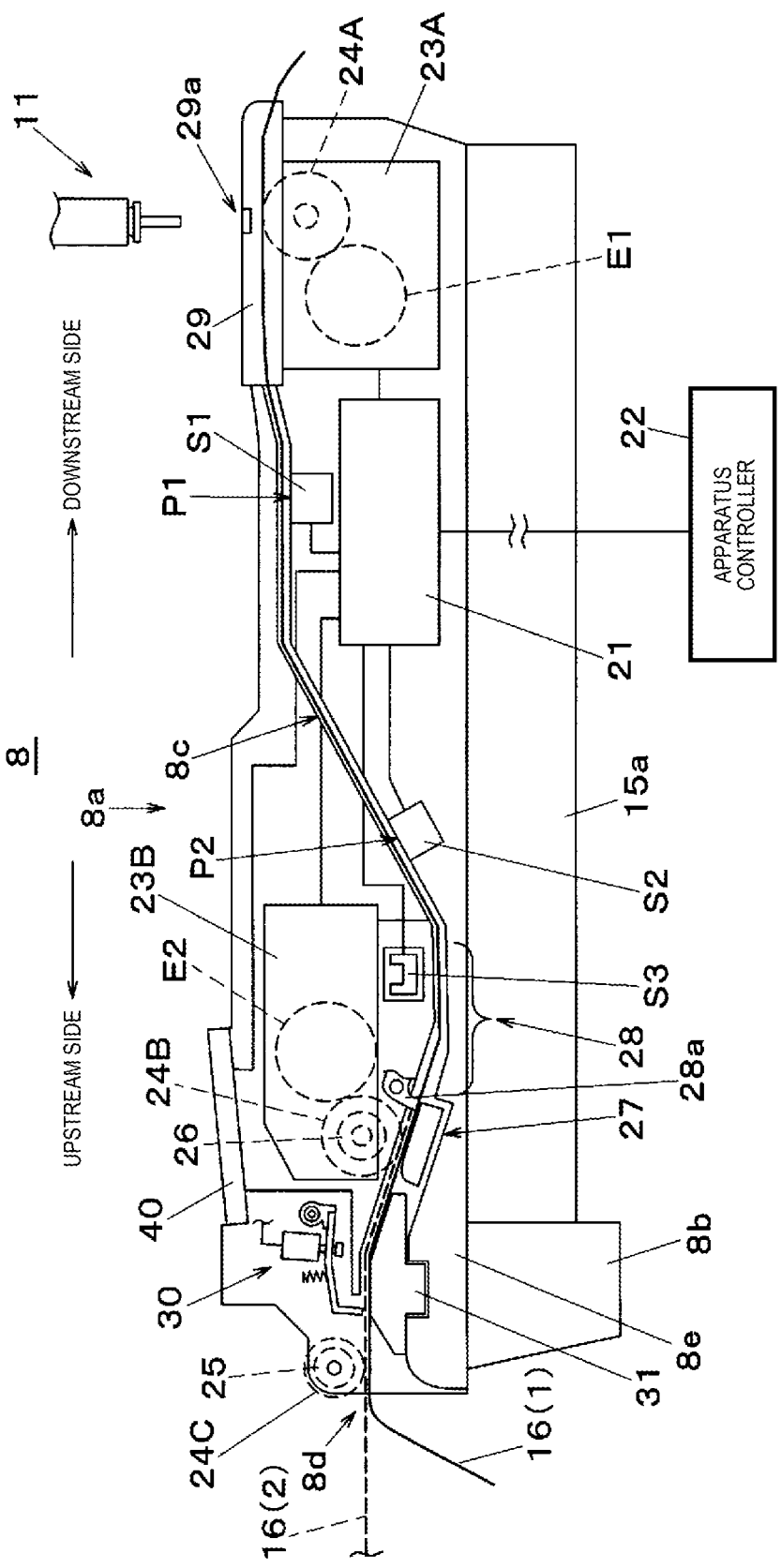
FIG. 4 is a configuration diagram of a tape feeder of the embodiment of the present disclosure.

Next, a configuration and a function of tape feeder 8 will be described with reference to FIG. 4. Tape feeder 8 (component supply unit) of the embodiment is capable of supplying up to two (N) carrier tapes 16 for storing the component, and inserted carrier tape 16 can be automatically transported. Note that, N is a natural number equal to or larger than 1. As illustrated in FIG. 4, tape feeder 8 is configured to include mount 8*b* which is projected to the lower side from the lower surface of main body 8*a* and main body 8*a*. In a state where tape feeder 8 is mounted with the lower surface of main body 8*a* along feeder base 15*a*, tape feeder 8 is fixedly mounted on component supplier 7, and feeder controller 21 built in tape feeder 8 so as to control tape-feeding is electrically connected to apparatus controller 22 of component mounting apparatuses M2 to M4.

Tape travelling path 8*c* for guiding carrier tape 16 which is drawn from supply reel 17 and is introduced into main body 8*a* is provided in the inside of main body 8*a*. Tape travelling path 8*c* is provided in main body 8*a* from insertion port 8*d* opened at an upstream end in the tape-feeding direction into which carrier tape 16 is inserted to the component adsorption position at which the component is extracted by mounting head 11. In the process of continuously perform the component mounting operation, the plurality of carrier tapes 16 are sequentially inserted from insertion port 8*d* so as to be replenished to tape feeder 8.

Tape feeder 8 described in the embodiment employs a non-splicing method (an automatic loading type) in which two carrier tapes 16 which are transported almost at the same time are supplied by being sequentially inserted into insertion port 8*d* in a state of being separated from each other. Therefore, trailing end E of carrier tape 16(1) (hereinafter, simply referred to as "preceding tape 16(1)") which is already mounted on tape feeder 8 and is a target for extracting the component by mounting head 11, and leading end T of carrier tape 16(2) (hereinafter, simply referred to as "succeeding tape 16(2)") which is additionally mounted at the time of component shortage are not necessarily bonded to each other by using a bonding tape.

Sprocket 24C with which the additionally mounted succeeding tape 16(2) is engaged is provided in insertion port 8*d*. Sprocket 24C has a function of preventing succeeding tape 16(2) from falling down by regulating the tape-feeding direction of succeeding tape 16(2) by one-way clutch mechanism 25 which is built in sprocket 24C. Shutter mechanism 30 is disposed on the downstream side of sprocket 24C. Shutter mechanism 30 has a function that carrier tape 16 inserted from insertion port 8*d* is allowed or prohibited from entering tape travelling path 8*c* on the downstream side by causing shutter 32*a* (refer to FIG. 5A to FIG. 5C) of shutter driving member 32 to be vertically moved with respect to guide member 31 which is fixed into frame 8*e* forming main body 8*a*.

In FIG. 4, first tape-feeding mechanism 23A and second tape-feeding mechanism 23B for tape-feeding of preceding tape 16(1) and succeeding tape 16(2) are disposed on the downstream side and the upstream side of tape traveling path 8*c*. Second tape-feeding mechanism 23B provided on the upstream side has a function of continuously tape-feeding additionally mounted succeeding tape 16(2) to first tape-feeding mechanism 23A side from insertion port 8*d* side, and rotationally drives sprocket 24B by using second motor E2. Encoder 26 is built in sprocket 24B as rotation detector, and the detected rotation detection signal is transferred to feeder controller 21.

Tape pressing mechanism 27 and tape stopper mechanism 28 are disposed on the lower side of second tape-feeding mechanism 23B. Succeeding tape 16(2) which is inserted from insertion port 8*d* is pressed by tape pressing mechanism 27 with respect to sprocket 24B, and is engaged with sprocket 24B so as to be fed by second tape-feeding mechanism 23B. Tape stopper mechanism 28 has a function of temporarily stopping leading end T of additionally inserted succeeding tape 16(2) in a state where preceding tape 16(1) is being mounted, by stopper member 28*a*.

First tape-feeding mechanism 23A provided on the downstream side has a function of pitch-feeding preceding tape 16(1) to the component adsorption position by mounting head 11 at a predetermined pitch, and rotationally drives sprocket 24A by using first motor E1. Pressing member 29 which presses preceding tape 16(1) from above and expose the component stored in preceding tape 16(1) is mounted above first tape-feeding mechanism 23A, and the component which is pitch-fed to the component adsorption position is picked up through vacuum suctioning by suction nozzle 11*b* of mounting head 11 via component extracting opening 29*a* which is formed on pressing member 29.

In FIG. 4, first detecting position P1 for detecting carrier tape 16 is set on the upstream side of first tape-feeding mechanism 23A in tape travelling path 8*c*. Similarly, second detecting position P2 for detecting carrier tape 16 is set on the downstream side of second tape-feeding mechanism 23B, that is, on the upstream side from first detecting position P1. First sensor S1 and second sensor S2 which are respectively disposed on first detecting position P1 and second detecting position P2 detect existence of carrier tape 16 in first detecting position P1 and second detecting position P2. Further, third sensor S3 for detecting that succeeding tape 16(2) is in contact with stopper member 28*a* is disposed in tape stopper mechanism 28.

The detection results by first sensor S1, second sensor S2, and third sensor S3 are transferred to feeder controller 21. Feeder controller 21 controls first tape-feeding mechanism 23A and second tape-feeding mechanism 23B based on the detection results and the rotation detection result by encoder 26. With this, the tape-feeding operation of preceding tape 16(1) and succeeding tape 16(2) in tape feeder 8 is performed in accordance with the predetermine control pattern.

In tape stopper mechanism 28, in a state where preceding tape 16(1) is below stopper member 28*a*, succeeding tape 16(2) is temporarily stopped when leading end T of inserted succeeding tape 16(2) which overlaps preceding tape 16(1) is in contact with stopper member 28*a*. In a state where preceding tape 16(1) is not present, succeeding tape 16(2) passes below stopper member 28*a*. Therefore, third sensor S3 detects inserted succeeding tape 16(2) in the state where preceding tape 16(1) is below stopper member 28*a*. In the state where preceding tape 16(1) is not present, inserted succeeding tape 16(2) is not detected.

In FIG. 4, operation and display panel 40 is disposed on an upper surface of tape feeder 8 on the upstream side. Operation and display panel 40 is connected to feeder controller 21. Operation and display panel 40 is provided with various operation buttons such as an operation button for performing a tape-feeding operation and a tape rewinding operation by first tape-feeding mechanism 23A and second tape-feeding mechanism 23B, an operation button for performing a shutter opening and closing operation in shutter mechanism 30, and an input button for writing component ID in a memory built in tape feeder 8. Further, operation and display panel 40 is provided with a notification light for notifying a predetermined item set in advance.

Figure 5A:
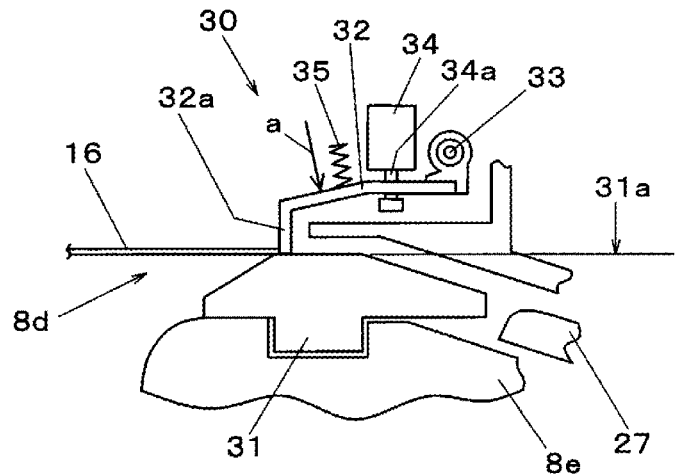
FIG. 5A is a diagram illustrating a function of a shutter mechanism provided in the tape feeder of the embodiment of the present disclosure.

Next, a configuration and a function of shutter mechanism 30 which is provided in tape feeder 8 will be described with reference to FIG. 5A to FIG. 5C. In FIG. 5A, guide member 31 is fixed into frame 8e by aligning guide surface 31a with the tape-feeding height in which carrier tape 16 inserted from insertion port 8d is fed. Guide surface 31a of guide member 31 has a shape in which guide member 31 is capable of guiding carrier tape 16 by supporting the lower surface side thereof.

Shutter driving member 32 of which the end on the downstream side is axially supported by shaft support 33 is disposed above guide member 31 in a substantially horizontal posture. Shutter 32a which is downwardly bent is provided at the end of shutter driving member 32 on the upstream side, and when shutter driving member 32 is rotated around shaft support 33, the lower end of shutter 32a can come in contact with guide surface 31a.

Above shutter driving member 32, solenoid 34 which is excitedly driven by feeder controller 21 is disposed with driving axis 34a being downwardly projected. Driving axis 34a is attached to shutter driving member 32 such that an upward driving force can be transferred. Further, shutter driving member 32 is downwardly (Arrow a) urged by spring member 35 disposed on the upper surface thereof. When solenoid 34 as illustrated in FIG. 5A is in a state of being non-excited (non-conductive state), the driving force of solenoid 34 does not act on shutter driving member 32. Accordingly, shutter mechanism 30 becomes in a closed state where shutter 32a is in contact with guide surface 31a by an urging force of spring member 35. In this state, carrier tape 16 inserted from insertion port 8d is prohibited from entering toward the downstream side by shutter 32a which is in contact with guide surface 31a.

Figure 5B:
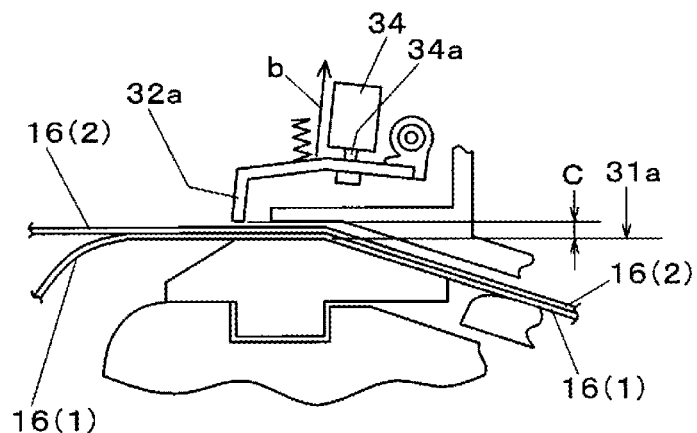
FIG. 5B is a diagram illustrating a function of the shutter mechanism provided in the tape feeder of the embodiment of the present disclosure.

FIG. 5B illustrates a state where driving axis 34a is upwardly (Arrow b) moved by excitedly driving solenoid 34 by feeder controller 21 (an excited state). With this, shutter driving member 32 is upwardly displaced, and predetermined clearance C is secured between the lower end of shutter 32a and guide surface 31a of guide member 31, and thus shutter mechanism 30 becomes in the closed state. In this state, carrier tape 16 inserted from insertion port 8d is allowed to enter toward the downstream side by passing through clearance C. With this, in a state where preceding tape 16(1) is inserted from insertion port 8d so as to be fed to travelling path 8c, succeeding tape 16(2) can be inserted by overlapping preceding tape 16(1) via clearance C between shutter 32a and guide surface 31a.

Figure 5C:
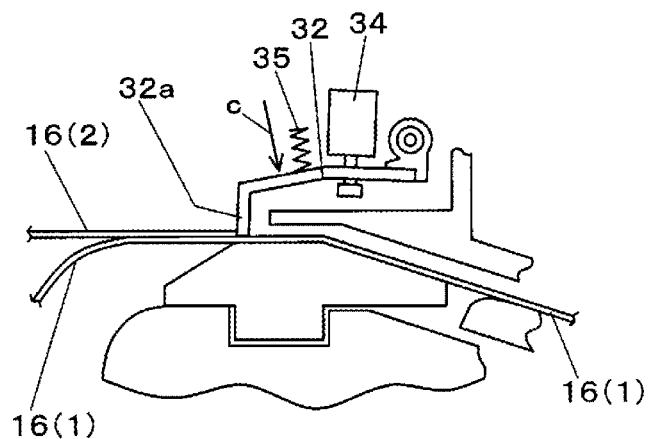
FIG. 5C is a diagram illustrating a function of the shutter mechanism provided in the tape feeder of the embodiment of the present disclosure.

FIG. 5C illustrates a case where preceding tape 16(1) becomes in a non-conductive state where a power is turned off while preceding tape 16(1) is supplied. In this case, solenoid 34 is in the non-excited state, and thus shutter driving member 32 is downwardly (Arrow c) pressed by spring member 35, and shutter 32a is in contact with the upper surface of preceding tape 16(1). In such a state, even though succeeding tape 16(2) is tried to be inserted from insertion port 8d, the insertion of succeeding tape 16(2) is prohibited by shutter 32a in a closed state.

The excitation state or non-excited state of solenoid 34 is controlled by feeder controller 21 which receives commands from component mounting apparatuses M2 to M4, the calculation result by an internal processor, and an operation of operation and display panel 40 by an operator. In addition, in a state where shutter mechanism 30 is opened or closed by conduction or non-conduction to solenoid 34, a state where shutter mechanism 30 is opened or closed is displayed by turning on an indicator light which is disposed on operation and display panel 40 or other portions. As described above, tape feeder 8 (component supply unit) is provided with shutter 32a which prevents carrier tape 16 from being inserted into tape feeder 8.

Figure 6:
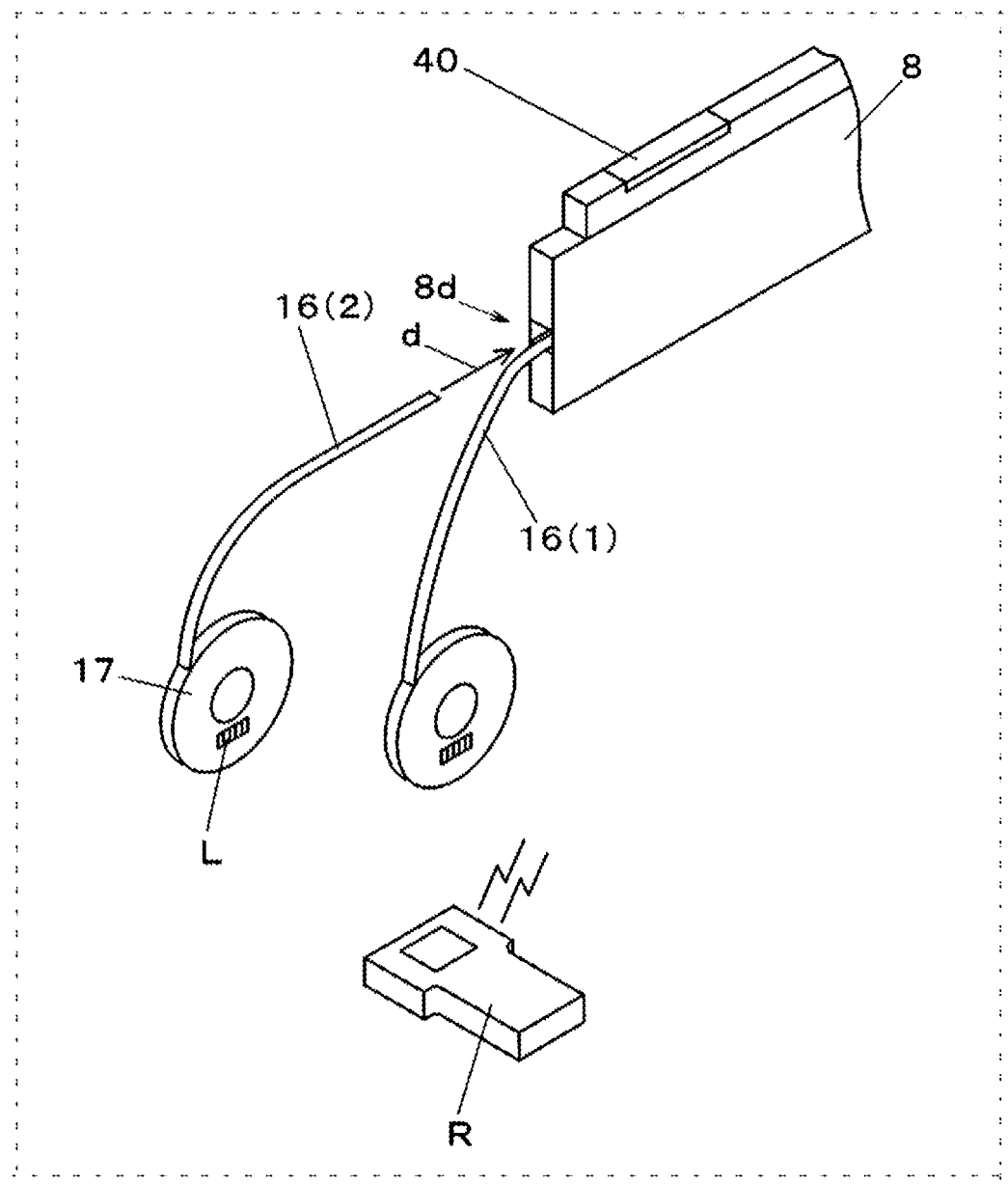
FIG. 6 is a diagram illustrating a reading operation of a component ID in the tape feeder of the embodiment of the present disclosure.

FIG. 6 illustrates an outline of a component replenishing operation in automatic loading-type tape feeder 8. In automatic loading-type tape feeder 8, succeeding tape 16(2) is inserted (Arrow d) into insertion port 8d of tape feeder 8 on which preceding tape 16(1) is mounted. Before succeeding tape 16(2) for replenishment is inserted into tape feeder 8, the operator reads out bar code label L (component ID) which is adhered to prepared supply reel 17 in advance by using barcode reader R. That is, barcode reader R is reading unit for reading component ID adhered to carrier tape 16.

Figure 7A:
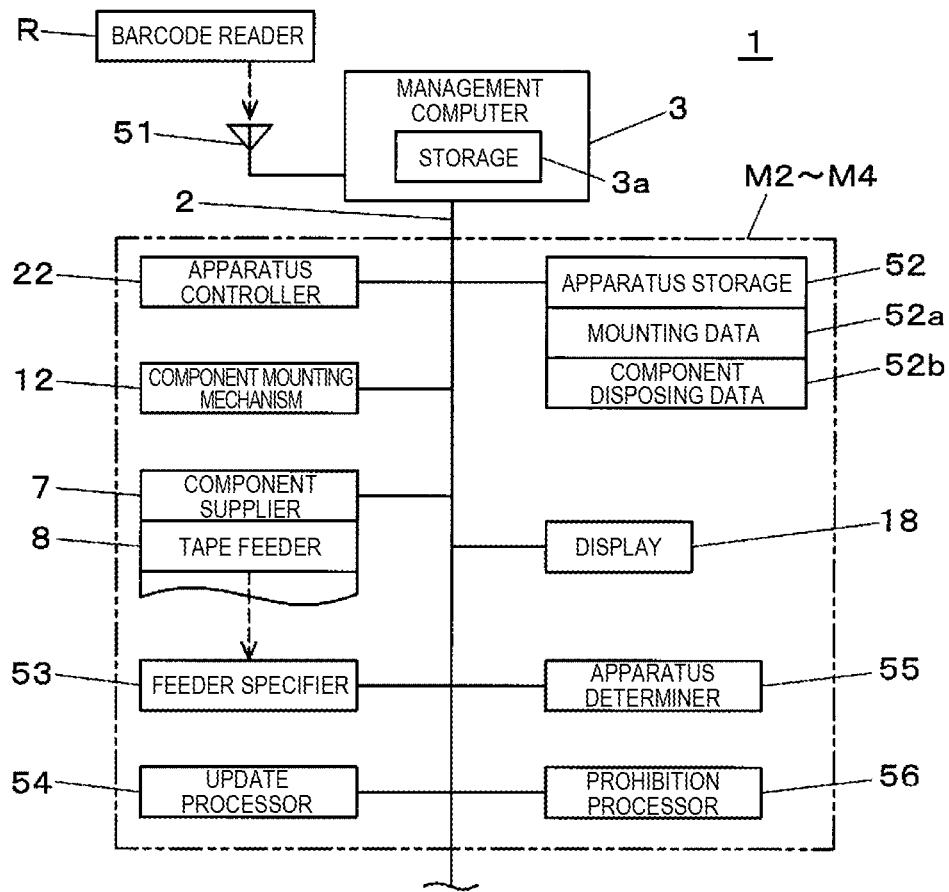
FIG. 7A is a block diagram illustrating a configuration of a control system of the component mounting system of the embodiment of the present disclosure.

The read-out result is transferred to management computer 3 via wireless receiver 51, and is further transferred to component mounting apparatuses M2 to M4 from management computer 3, and to tape feeder 8 from component mounting apparatuses M2 to M4 (refer to FIG. 7A). In addition, when it is determined that carrier tape 16 is replenished to tape feeder 8 based on read-out component ID, shutter mechanism 30 becomes in an opened state, and the determination result is notified by turning on the indicator light of operation and display panel 40. In response to this notification, the operator inserts carrier tape 16 which is drawn from supply reel 17 into tape feeder 8 as succeeding tape 16(2).

Figure 7B:
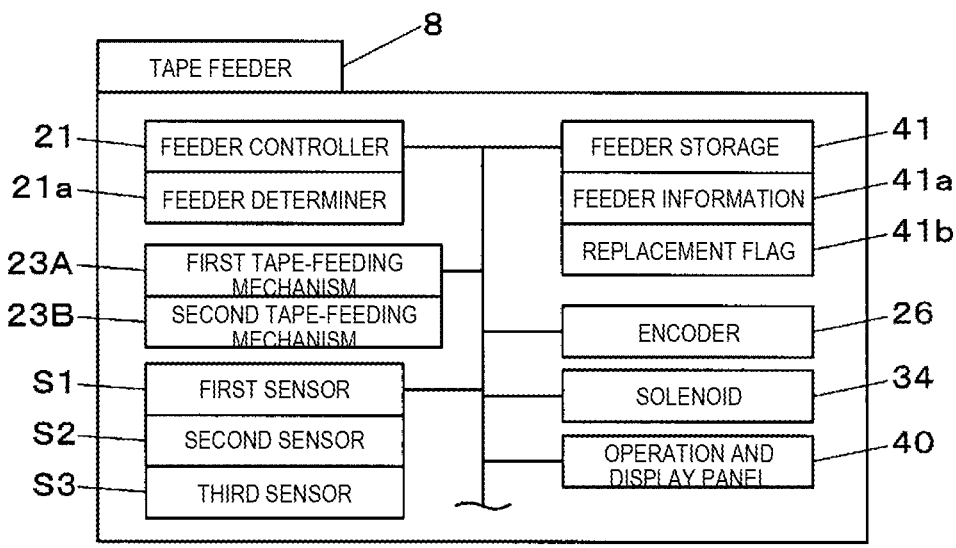
FIG. 7B is a block diagram illustrating a configuration of a control system of the tape feeder of the embodiment of the present disclosure.

Next, configurations of control systems of component mounting system 1 and component mounting system 1 will be described with reference to FIG. 7A and FIG. 7B. Component mounting system 1 is configured to include tape feeder 8 (component supply unit) and component mounting apparatuses M2 to M4. FIG. 7A illustrates the entire configuration of the component supply system, and FIG. 7B illustrates a configuration in which a plurality of tape feeders 8 are respectively mounted on component suppliers 7 of component mounting apparatuses M2 to M4. Component mounting system 1 notifies the operator a case where carrier tape 16 which is replenished to tape feeder 8 to which N carrier tapes are able to be replenished is an (N+1)-th.

In FIG. 7A, management computer 3 is connected to component mounting apparatuses M2 to M4 via communication network 2. Management computer 3 is provided with wireless receiver 51 for receiving a signal from a portable terminal such as barcode reader R. Storage 3a which is provided in management computer 3 stores various items of data such as production data used for the component mounting operation of component mounting apparatuses M2 to M4. In the component mounting operation, the production data is downloaded from management computer 3 and stored in apparatus storage 52 of component mounting apparatuses M2 to M4, and items of operation information of component mounting apparatuses M2 to M4 are collected by management computer 3.

Apparatus controller 22 which is provided in component mounting apparatuses M2 to M4 is an arithmetic processing unit serves as a CPU, and controls each of component mounting mechanism 12, component supplier 7, and display 18 by executing a processing program stored in apparatus storage 52. In addition, component mounting apparatuses M2 to M4 are provided with feeder specifier 53 which is an information processor, update processor 54, apparatus determiner 55, and prohibition processor 56. The control processing is performed by apparatus controller 22 with reference to various items of production data of mounting data 52*a*, component disposing data 52*b*, and the like which are stored in apparatus storage 52.

Mounting data 52*a* is data including types of components to be mounted, a mounting position coordinates of the substrate, and the like, and is stored for each substrate to be produced. Component disposing data 52*b* is data for defining a feeder address of tape feeder 8 in component supplier 7, the number of carrier tape 16 in a state of being supplied to tape feeder 8, and component ID.

Here, an example of component disposing data 52*b* will be described with reference to FIG. 8A. FIG. 8A illustrates component disposing data 52*b* of component supplier 7 on which tape feeder 8 which is capable of supplying up to two (N=2) carrier tapes 16 is mounted. In respond to each of feeder addresses 61, component disposing data 52*b* stores feeder ID62 for specifying tape feeder 8 which is mounted on feeder address 61, and the number of carrier tape 16 (number of tapes 63) in a state of being inserted and supplied to tape feeder 8. Further, component ID 64(1) of carrier tape 16 which corresponds to preceding tape 16(1), and component ID 64(2) of carrier tape 16 which corresponds to succeeding tape 16(2) are stored.

In FIG. 8A, tape feeder 8 in which feeder address 61 is mounted at a position of f1 and feeder ID62 is Faaaa is in a state of being capable of supplying two carrier tapes 16 (the number of tapes 63 is two), and component ID 64 is stored in both of component ID 64(1) and component ID 64(2). In addition, tape feeder 8 in which feeder address 61 is mounted at a position of f2, and feeder ID62 is Fbbbb is in a state of being capable of supplying one carrier tape 16 (the number of tapes 63 is one), component ID 64 is stored in component ID 64(1), and component ID 64(2) becomes vacant (in the drawings, denoted by "-").

Further, tape feeder 8 in which feeder address 61 is mounted at a position of f3, and feeder ID62 is Fcccc is not in a state of being capable of supplying carrier tape 16 (the number of tapes 63 is zero), and both of component ID 64(1) and component ID 64(2) become vacant.

In FIG. 7A, feeder specifier 53 (a detector) detects operation input information of operation and display panel 40 of tape feeder 8 by the operator, or the component replenishing operation with respect to tape feeder 8 (component supply unit) from the detection results, by third sensor S3, of carrier tapes 16 which are provided in each of tape feeders 8, and specifies feeder ID62 and feeder address 61 of tape feeder 8. When carrier tape 16 is normally replenished to tape feeder 8, update processor 54 performs an update process of updating component disposing data 52*b* and feeder information 41*a* based on component ID 64 which is read-out by barcode reader R.

Apparatus determiner 55 (a determiner) performs a number determining process of determining the number of carrier tape 16 which is replenished to tape feeder 8 (a first number determining process), based on component ID 64 which is attached to supply reel 17 in which carrier tape 16 (hereinafter, referred to as "replenishment carrier tape 16\*") in which the replenishing operation with respect to tape feeder 8 (component supply unit) is detected is wound and stored and component disposing data 52*b*. Specifically, apparatus determiner 55 determines what number replenishment carrier tape 16\* is based on the number of tapes 63 or the number of component IDs 64(1) and component IDs 64(2) which are not vacant in component disposing data 52*b*.

That is, apparatus determiner 55 determines whether or not the number of carrier tape 16 is the (N+1)-th based on the number of component IDs 64 adhered to replenishment carrier tape 16\* and the number of component IDs 64 included in component disposing data 52*b* (component information) of carrier tape 16 which is in a stated of being stored and supplied to apparatus storage 52. Apparatus storage 52 corresponds to a system storage for storing component disposing data 52*b* of carrier tape 16 in a state of being supplied to tape feeder 8 at the time of determination.

Prohibition processor 56 causes display 18 (a notifier) or operation and display panel 40 (a notifier) to notify the operator of a case where replenishment carrier tape 16\* is determined to be the (N+1)-th by apparatus determiner 55 (the determiner). In addition, prohibition processor 56 performs a prohibition process of prohibiting the update for component disposing data 52*b* (component information), which is stored in component ID 64 of replenishment carrier tape 16\*, by update processor 54.

Further, prohibition processor 56 performs the prohibition process in which shutter 32*a* is controlled to be closed in a case where shutter 32*a* of tape feeder 8 in which the replenishing operation is detected is opened, and a control signal is transferred so as to maintain shutter 32*a* to be in a closed state in a case where shutter 32*a* of tape feeder 8 is closed. That is, prohibition processor 56 is a shutter controller for controlling the shutter 32*a* to be in a closed state. Through the aforementioned prohibition process, it is prevented that the (N+1)-th replenishment carrier tape 16\* is inserted from insertion port 8*d* of tape feeder 8, and thus component disposing data 52*b* is erroneously updated.

Here, configuration examples in which feeder specifier 53, update processor 54, apparatus determiner 55, and prohibition processor 56 are described as processing functions of component mounting apparatuses M2 to M4 are described; however, these processing functions may be set as processing functions of management computer 3. Display 18 displays various types of screens required in performing the component mounting operation by component mounting apparatuses M2 to M4. These display screens display the case where replenishment carrier tape 16\* is determined to be (N+1)-th in the number determining process and function as a notifier for visually notifying the operator of the aforementioned case.

Next, a configuration of the control system of tape feeder 8 will be described. In FIG. 7B, feeder controller 21 which is provided with tape feeder 8 controls first tape-feeding mechanism 23A, second tape-feeding mechanism 23B, and solenoid 34 of shutter mechanism 30. The control is performed based on control signals from component mounting apparatuses M2 to M4, the operation input from operation and display panel 40, and signals from encoder 26 built in sprocket 24B, first sensor S1, second sensor S2, and third sensor S3. The control process is performed by feeder controller 21 with reference to various items of data such as feeder information 41*a* and replacement flag 41*b* which are stored in feeder storage 41 which is provided in tape feeder 8.

Component ID 64 of carrier tape 16 which is in a state of being inserted and supplied to tape feeder 8 is stored in feeder information 41*a*. Here, an example of feeder information 41*a* will be described with reference to FIG. 8B. FIG. 8B illustrates feeder information 41*a* in tape feeder 8 to which two (N=2) carrier tapes 16 are able to be supplied. Feeder information 41*a* stores component ID 64(1) of carrier tape 16 which corresponds to preceding tape 16(1), and component ID 64(2) of carrier tape 16 which corresponds to succeeding tape 16(2).

In tape feeder 8 to which two carrier tapes 16 are being supplied, component ID 64 is stored in both of component ID 64(1) and component ID 64(2). In tape feeder 8 to which one carrier tape 16 is being supplied, component ID 64(1) is only stored in component ID 64 and component ID 64(2) is vacant. In tape feeder 8 to which carrier tape 16 is not being supplied, both of component ID 64(1) and component ID 64(2) become vacant. Feeder information 41a as illustrated in FIG. 8B which is feeder information 41a of tape feeder 8 in which feeder ID62 is Faaaa, among component disposing data 52b as illustrated in FIG. 8A indicates that two carrier tapes are in a state of being supplied.

As such, feeder storage 41 (supply unit storage) stores feeder information 41a including component ID 64 of carrier tape 16 which is in a state of being supplied to tape feeder 8 (component supply unit) at that time. In FIG. 7B, replacement flag 41b illustrates whether or not tape feeder 8 is a "replacing process mode" for replacing carrier tape 16. Replacement flag 41b is set to be turned on when preceding tape 16(1) is equal to or less than a predetermined residual amount, and is set to be turned off when the replacement of succeeding tape 16(2) is finished, as described below.

Feeder controller 21 is provided with feeder determiner 21a as an internal processing function. Feeder determiner 21a detects the replenishing operation of carrier tape 16 with respect to tape feeder 8 based on the detection result, by third sensor S3 which detects that the leading end of succeeding tape 16(2) which is additionally inserted into tape feeder 8 in a state where preceding tape 16(1) is mounted on tape feeder 8 is in contact with stopper member 28a. That is, third sensor S3 is a sensor for detecting carrier tape 16 which is inserted into tape feeder 8 (component supply unit). Thus, feeder determiner 21a corresponds to a detector that detects the replenishing operation of carrier tape 16 with respect to tape feeder 8 based on the detection result by third sensor S3.

In addition, feeder determiner 21a performs a number determining process (a second number determining process) of determining what number replenishment carrier tape 16* is based on feeder information 41a. That is, feeder determiner 21a determines whether or not replenishment carrier tape 16* is the (N+1)-th based on the number of component IDs 64 included in feeder information 41a (component information) of carrier tape 16 in a state of being supplied to tape feeder 8 at the time of determination. Operation and display panel 40 (the notifier) notifies the operator of a case where replenishment carrier tape 16* is the (N+1)-th. In addition, feeder determiner 21a sets replacement flag 41b based on the detection results of second sensor S2 and third sensor S3 and a change of the detection result, and a third number determining process described below is performed based on the aforementioned information.

Next, carrier tape 16 of replacing process and replacement flag 41b in automatic loading-type tape feeder 8 will be described with reference to FIG. 9A to FIG. 9C, and FIG. 10A to FIG. 10C. Replacement flag 41b stored in feeder storage 41 illustrates whether or not tape feeder 8 is in the replacing process mode in which carrier tape 16 for supplying the component is replaced with succeeding tape 16(2) from preceding tape 16(1).

Figure 9A:
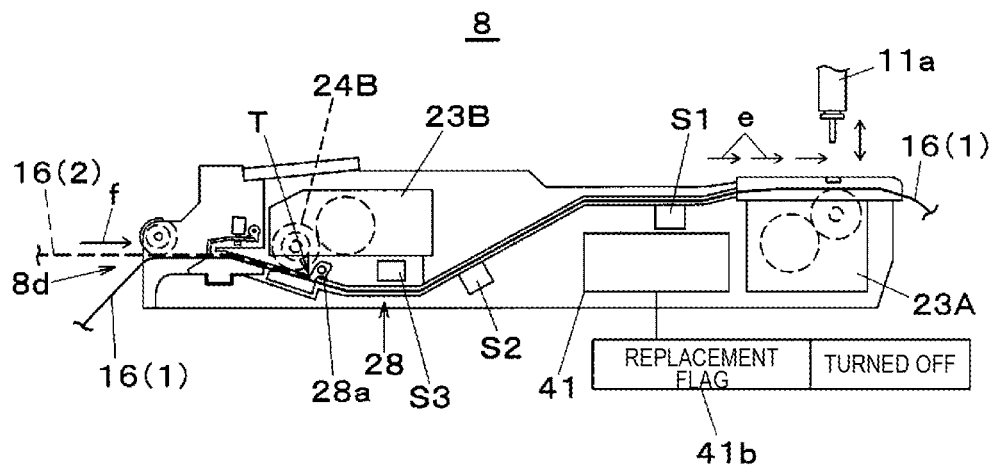
FIG. 9A is a diagram illustrating steps of a replacing process and a replacement flag of a carrier tape in the tape feeder of the embodiment of the present disclosure.

In FIG. 9A, preceding tape 16(1) is pitch-fed (Arrow e) to the component adsorption position by first tape-feeding mechanism 23A such that the component is extracted (the component is supplied) by mounting head 11 (holding head 11a) at the component adsorption position. Succeeding tape 16(2) which is inserted (Arrow f) from insertion port 8d for supplying the component is engaged with sprocket 24B of second tape-feeding mechanism 23B, and is stopped when leading end T is in contact with stopper member 28a of tape stopper mechanism 28. In this state, each of first sensor S1 and second sensor S2 detects preceding tape 16(1), third sensor S3 detects leading end T of succeeding tape 16(2), and replacement flag 41b is set to be turned off.

Figure 9B:
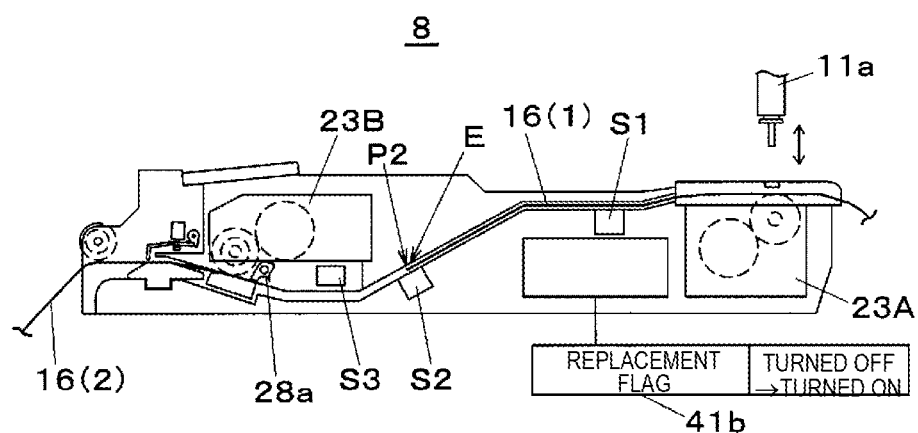
FIG. 9B is a diagram illustrating steps of the replacing process and the replacement flag of the carrier tape in the tape feeder of the embodiment of the present disclosure.

When component is supplied from preceding tape 16(1), and trailing end E of preceding tape 16(1) reaches second detecting position P2 as illustrated in FIG. 9B, trailing end E is detected by second sensor S2. At this time, first sensor S1 detects preceding tape 16(1), and third sensor S3 is turned off since leading end T of succeeding tape 16(2) is separated from stopper member 28a. In this case, replacement flag 41b is changed to be turned on from being turned off, and then first tape-feeding mechanism 23A and second tape-feeding mechanism 23B are controlled based on the control pattern of the "replacing process mode" which is set in advance.

Figure 9C:
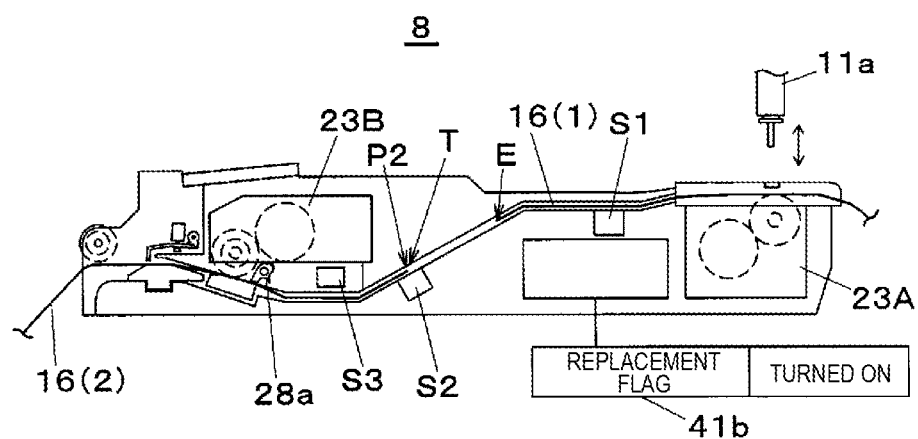
FIG. 9C is a diagram illustrating steps of the replacing process and the replacement flag of the carrier tape in the tape feeder of the embodiment of the present disclosure.

When performing the replacing process mode, succeeding tape 16(2) in which the temporary stop by stopper member 28a is released is continuously tape-fed until leading end T reaches second detecting position P2 by second tape-feeding mechanism 23B. In addition, as illustrated in FIG. 9C, when leading end T of succeeding tape 16(2) is detected by second sensor S2, second tape-feeding mechanism 23B is stopped and succeeding tape 16(2) is temporarily stopped at the position in which the aforementioned detection is performed. In this case, first sensor S1 detects preceding tape 16(1), and third sensor S3 is turned off.

Figure 10A:
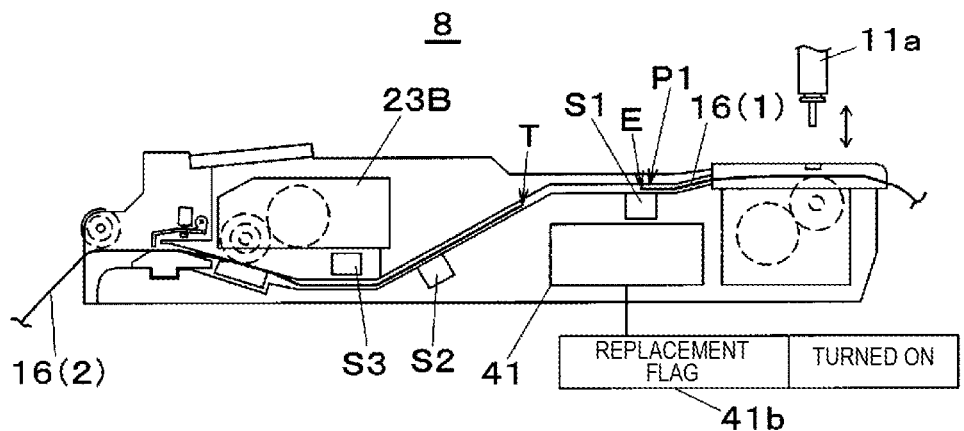
FIG. 10A is a diagram illustrating steps of the replacing process and the replacement flag of the carrier tape in the tape feeder of the embodiment of the present disclosure.

After that, preceding tape 16(1) is pitch-fed for supplying the component, and succeeding tape 16(2) is tape-fed in the state of maintaining an interval from preceding tape 16(1). Further, when trailing end E of preceding tape 16(1) reaches first detecting position P1 as illustrated in FIG. 10A, trailing end E is detected by first sensor S1. At this time, second sensor S2 detects succeeding tape 16(2), and third sensor S3 is turned off. After that, succeeding tape 16(2) is continuously tape-fed so as to move leading end T to first detecting position P1.

Figure 10B:
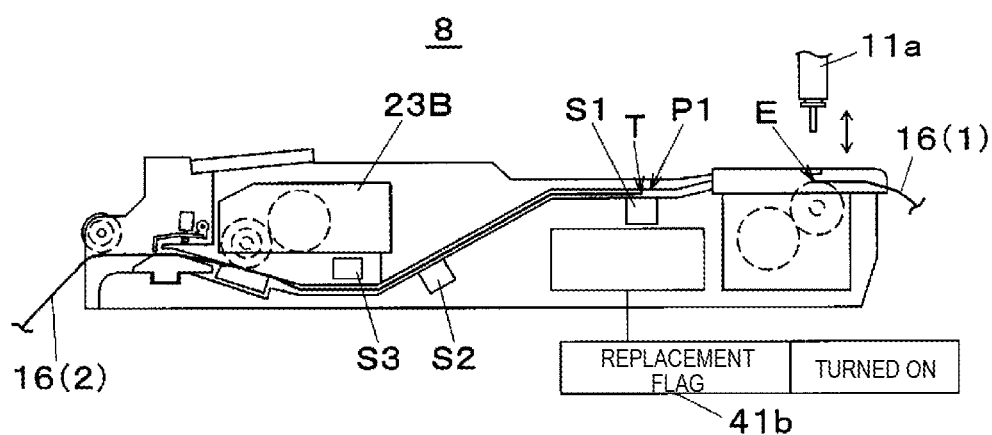
FIG. 10B is a diagram illustrating steps of the replacing process and the replacement flag of the carrier tape in the tape feeder of the embodiment of the present disclosure.

As illustrated in FIG. 10B, when leading end T of succeeding tape 16(2) reaches first detecting position P1 and is detected by first sensor S1, second tape-feeding mechanism 23B is stopped and succeeding tape 16(2) is temporarily stopped at the position in which the aforementioned detection is performed. In this case, second sensor S2 detects succeeding tape 16(2), and third sensor S3 is turned off.

Figure 10C:
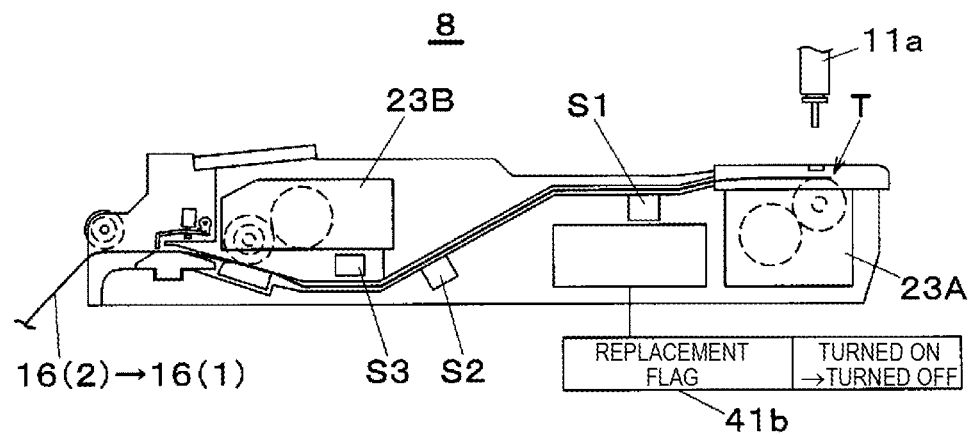
FIG. 10C is a diagram illustrating steps of the replacing process and the replacement flag of the carrier tape in the tape feeder of the embodiment of the present disclosure.

When preceding tape 16(1) finishes supplying the component (FIG. 10B), and preceding tape 16(1) is discharged from tape feeder 8, succeeding tape 16(2) is pitch-fed to the component adsorption position so as to prepare the component supply (FIG. 10C). When the component supply is prepared by succeeding tape 16(2), the "replacing process mode" is finished by changing replacement flag 41b to be turned off from being turned on. At this time, each of first sensor S1 and second sensor S2 detects succeeding tape 16(2), and third sensor S3 is turned off.

When the "replacing process mode" is finished, update processor 54 performs the update process for component disposing data 52b. That is, the update process of substituting component ID 64(1) of preceding tape 16(1) which is discharged from tape feeder 8 with component ID 64(2) of succeeding tape 16(2) which is additionally set in the position of the component supply is performed. In addition, feeder controller 21 performs the update process of substituting component ID 64(1) of preceding tape 16(1) which is discharged in feeder information 41a with component ID 64(2) of succeeding tape 16(2) which is additionally set in the position of the component supply.

Figure 11A:
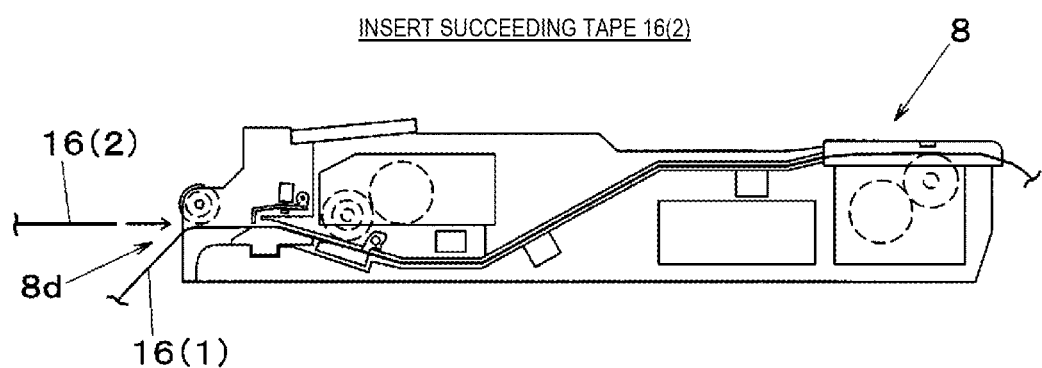
FIG. 11A is a diagram illustrating a state where a succeeding carrier tape is inserted into the tape feeder of the embodiment of the present disclosure.
Figure 11B:
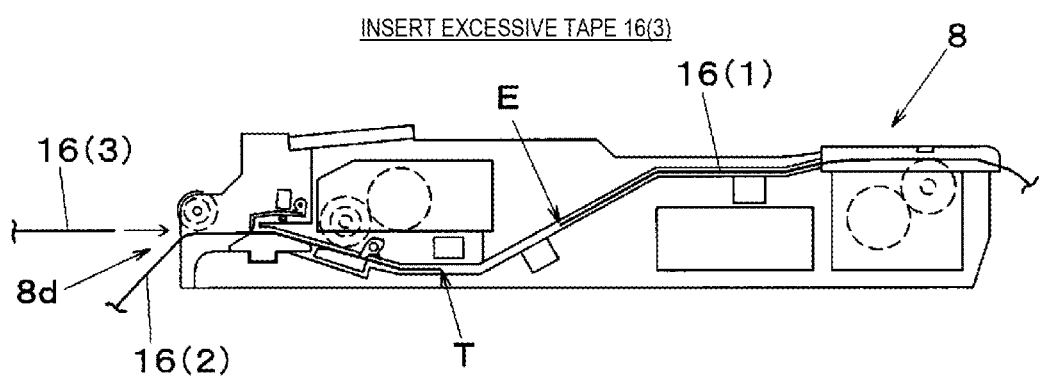
FIG. 11B is a diagram illustrating a state where an excess carrier tape is inserted into the tape feeder of the embodiment of the present disclosure.

Meanwhile, as illustrated in FIG. 11A and FIG. 11B, in automatic loading-type tape feeder 8, there may be two cases where trailing end E of replenished carrier tape 16 protrudes toward the upstream side from insertion port 8d. Firstly, a case where one carrier tape 16 is set in a state of being supplied to tape feeder 8 may be exemplified (FIG. 11A). In this case, inserted carrier tape 16 becomes second (N-th) succeeding tape 16(2) such that the component replenishing operation is normally performed.

Secondly, a case where two carrier tapes 16 are set to be supplied to tape feeder 8 (FIG. 11B) is exemplified. In this case, inserted carrier tape 16 corresponds to third ((N+1)-th) carrier tape 16(3) (hereinafter, simply referred to as "excessive tape 16(3)") which exceeds two carrier tapes which are able to be supplied to tape feeder 8. When excessive tape 16(3) is inserted, there may be an abnormal state where carrier tape 16 which exceeds the number of carrier tapes which are able to be supplied to automatic loading-type tape feeder 8 is set to be in a state of being supplied.

However, from the appearance, the operator cannot distinguish which of the two cases tape feeder 8 is in. In this regard, in component replenishing operation of automatic loading-type tape feeder 8, it is necessary to prevent the number of carrier tape 16 to be inserted from exceeding the number of carrier tapes which are able to be supplied by determining what number replenishment carrier tape 16* to be inserted is, as described below.

Figure 12:
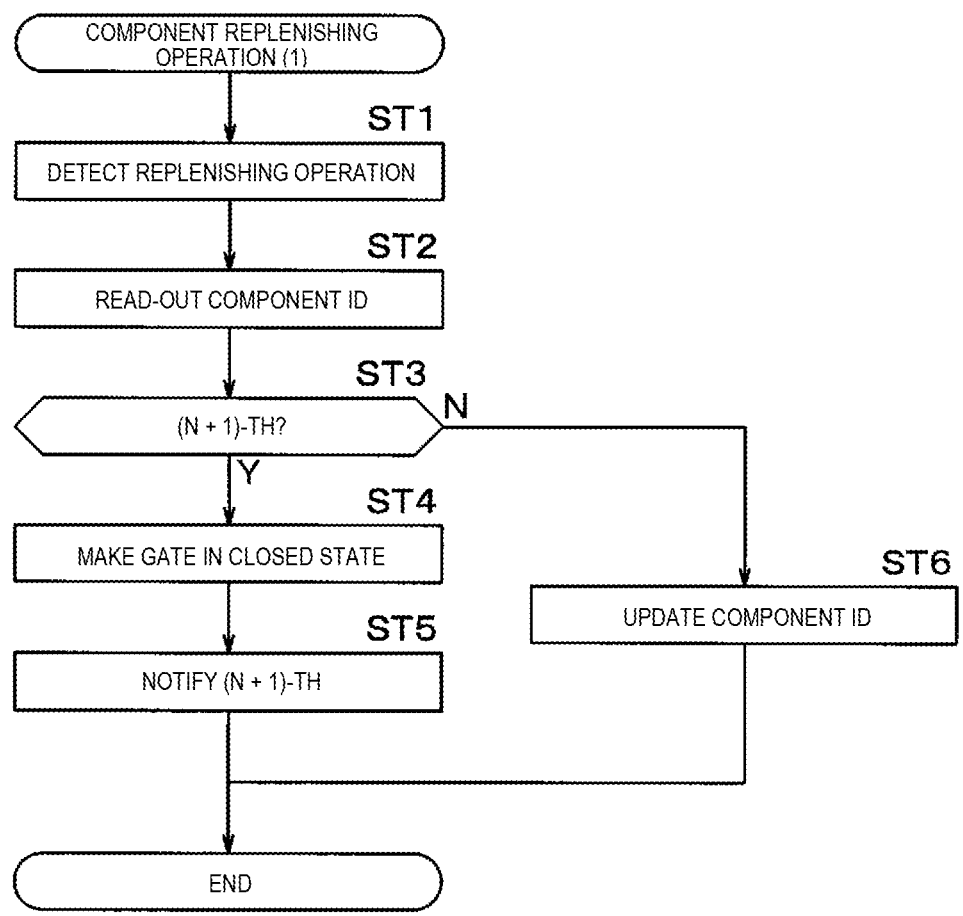
FIG. 12 is a flow chart illustrating a first example of a component replenishing operation in the component mounting system of the embodiment of the present disclosure.

A first example the component replenishing operation (a component supply method) with respect to automatic loading-type tape feeder 8 in component mounting system 1 of the present embodiment will be described with reference to FIG. 12. In the first example, the replenishing operation with respect to tape feeder 8 is detected, and it is determined what number carrier tape 16 with which tape feeder 8 is to be replenished is based on the component information of carrier tape 16 which is in a stated of being supplied to tape feeder 8.

First, in operation and display panel 40 of tape feeder 8 which supplies carrier tape 16, the operator operates an operation button for opening and closing the shutter or an input button for writing component ID. Feeder specifier 53 detects the replenishing operation of carrier tape 16 with respect to tape feeder 8 (component supply unit) by button operation of the operator (ST1: replenishing operation detecting step). Further, feeder specifier 53 specifies feeder ID62 and feeder address 61 of tape feeder 8 in which the component is replenished.

Next, the operator operates barcode reader R so as to read-out component ID 64 from bar code label L which is adhered to supply reel 17 for winding and storing replenishment carrier tape 16* in which the replenishing operation with respect to tape feeder 8 is detected. The read-out component ID 64 is transferred to component mounting apparatuses M2 to M4 and tape feeder 8 via wireless receiver 51 (ST2: component ID reading-out step).

Note that, a replenishing operation detecting step (ST1) and the component ID reading-out step (ST2) may be substituted with the following steps. That is, first, the operator reads-out component ID 64. With this, the replenishing operation is detected. Then, tape feeder 8 to be replenished may be specified as tape feeder 8 in which the replenishing operation is detected with reference to replenishment plan information which is created and stored based on a replenishment plan and in which component ID 64 is associated with feeder ID62 of tape feeder 8 to be replenished.

Subsequently, apparatus determiner 55 performs a first number determining process of determining what number carrier tape 16, with which the tape feeder 8 is to be replenished, replenishment carrier tape 16* is based on component ID 64 and component disposing data 52b of replenishment carrier tape 16* (ST3: a first determining step). That is, in the first number determining process, apparatus determiner 55 determines whether or not replenishment carrier tape 16* is the (N+1)-th based on the number of component IDs 64 of carrier tapes 16 in a state of being supplied to tape feeder 8 (component supply unit) at that time, in which the replenishing operation included in component disposing data 52b (component information) stored in apparatus storage 52 (system storage) is detected.

In first determining step (ST3), when it is determined that replenishment carrier tape 16* is (N+1)-th which exceeds the number (N) of carrier tapes which are able to be supplied to tape feeder 8 (Yes in ST3), the prohibition process is performed. That is, prohibition processor 56 does not allow component disposing data 52b to be updated by component ID 64 of replenishment carrier tape 16*, and further makes shutter 32a of tape feeder 8 be in a closed state (ST4) (refer to FIG. 5C). In detail, in a case where shutter 32a is in the opened state, shutter 32a is closed, and in a case where shutter 32a is already in the closed state, the operation button for opening and closing the shutter is prohibited from being input such that shutter 32a is maintained to be in the closed state. With this, it is possible to prevent the operator from inserting the excessive carrier tape 16 into tape feeder 8 by mistake.

Next, prohibition processor 56 notifies the operator that replenishment carrier tape 16* is the (N+1)-th through display 18 or operation and display panel 40 (ST5). Note that, shutter 32a may be in the closed state after the operator is notified by replacing the order of (ST4) and (ST5) with each other. In the first determination step (ST3), in a case where it is determined that the number of replenishment carrier tape 16* does not exceed the number of carrier tapes (N) which are able to be supplied to tape feeder 8 (No in ST3), the update process is performed. That is, update processor 54 performs the update process of component disposing data 52b and feeder information 41a when replenishment carrier tape 16* is replenished to tape feeder 8 (ST6).

Note that, in the replenishing operation detecting step (ST1), when the replenishing operation is detected by inputting the operation button for opening and closing the shutter, the determination is performed in the first determination step (ST3) and (ST4) may be performed without performing the component ID reading-out step (ST2). In other words, in a case where the operation button for opening and closing the shutter is pressed with respect to tape feeder 8 to which N carrier tapes 16 are already supplied, if there are N component IDs 64 are already present, the (N+1)-th carrier tape 16 is likely to be replenished, and thus "Yes" is denoted in the flowchart of the first determination step (ST3) and the shutter is closed in (ST4).

Note that, in the above-described component replenishing operation, the replenishing operation is detected based on an operation result of operation and display panel 40 in feeder specification step (ST1); however, the replenishing operation may be detected based on detection result of carrier tape 16 by third sensor S3 (a sensor) which is provided in each of tape feeders 8. In addition, in the number determining process (ST3), feeder determiner 21a (a determiner) may perform a number determining process (the second number determining process) based on feeder information 41a (the component information of carrier tape 16 which is in a stated of being supplied) stored in feeder storage 41 (supply unit storage). In addition, in the second number determining process, in a case where replenishment carrier tape 16* is determined to be the (N+1)-th, feeder determiner 21a (shutter controller) makes shutter 32a be in the closed state in (ST4).

Figure 13:
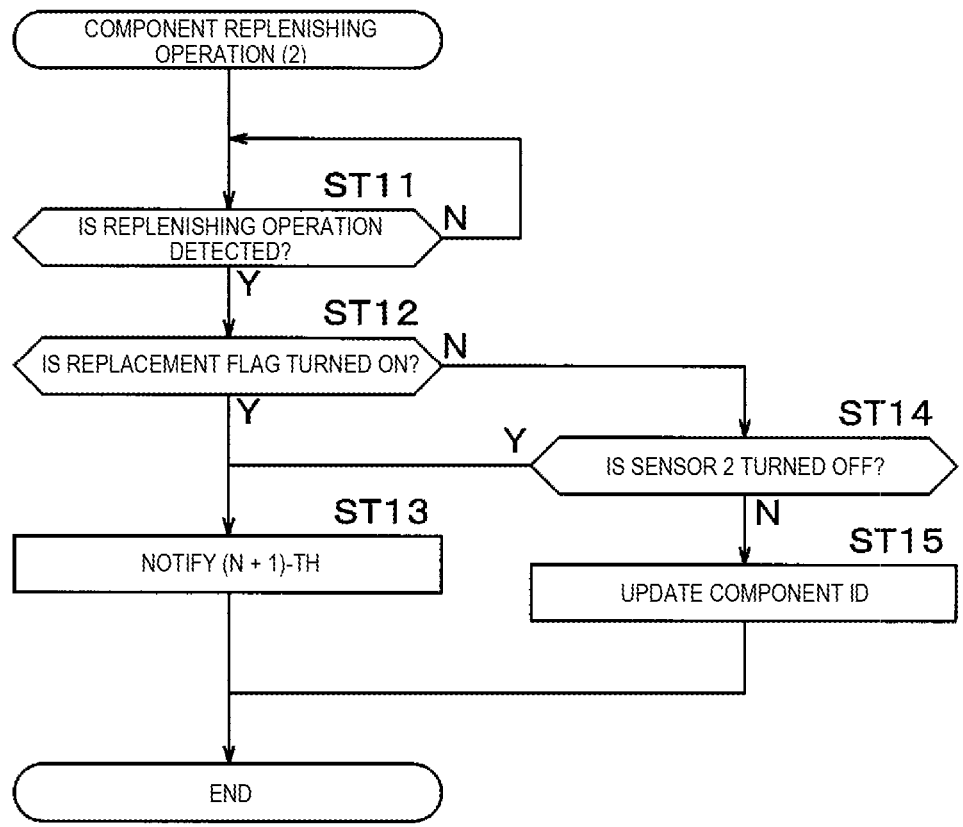
FIG. 13 is a flow chart illustrating a second example of the component replenishing operation in the component mounting system of the embodiment of the present disclosure.

Next, a second example of a component replenishing operation (a component supply method) with respect to tape feeder 8 in component mounting system 1 of the embodiment will be described with reference to FIG. 13. In the second example, it is determined what number replenishment carrier tape 16* is based on the detection results of second sensor S2 and third sensor S3 which are provided in tape feeder 8, and the state of replacement flag 41b. First, feeder determiner 21a detects a replenishing operation in which succeeding tape 16(2) or excessive tape 16(3) is inserted to tape feeder 8 by the detection result of third sensor S3 (ST11).

When third sensor S3 detects the replenishing operation (Yes in ST11), feeder determiner 21a determines whether or not replacement flag 41b is turned on (tape feeder 8 is in a "replacing operation mode") (ST12).

In a case where replacement flag 41b is turned on (Yes in ST12), feeder determiner 21a determines that two carrier tapes 16 are in a state of being supplied to tape feeder 8, and inserted carrier tape 16 is excessive tape 16(3), and notifies the determination result to operation and display panel 40 (ST13).

In other words, feeder determiner 21a determines that trailing end E of preceding tape 16(1) is on the downstream side from second detecting position P2 in which second sensor S2 is disposed, and excessive tape 16(3) is inserted in a state where succeeding tape 16(2) protrudes outside from insertion port 8d (refer to FIG. 11B). Note that, feeder determiner 21a may notify the determination result to display 18 of component mounting apparatuses M2 to M4.

In a case where replacement flag 41b is turned off (No in ST12), feeder determiner 21a determines whether or not second sensor S2 is turned off (in a state where carrier tape 16 is not present in second detecting position P2) (ST14). In a case where second sensor S2 is turned off (Yes in ST14), excessive tape 16(3) is inserted and the process proceeds to (ST13), and the process result is notified.

In a case where second sensor S2 is turned on (No in ST14), preceding tape 16(1) is present in second detecting position P2, and it is determined that preceding tape 16(1) protrudes outside from insertion port 8d, and thereby the component information is updated (ST15). That is, update processor 54 performs the update process for component disposing data 52b (component information) and feeder information 41a (component information) based on component ID 64 which is read-out with operating barcode reader R by the operator.

In addition, the component supplying operation in corresponding tape feeder 8 and other tape feeders 8 is continuously performed during the component replenishing operations of the above-described first example and the second example. That is, in component mounting system 1, the component replenishing operation is performed without stopping the component mounting operation.

In the above-described embodiment, component mounting system 1 includes automatic loading-type tape feeder 8 (component supply unit) which is capable of supplying up to N carrier tapes 16 for storing the component, and automatically transports inserted carrier tape 16, and component mounting apparatuses M2 to M4 which mount the component supplied from tape feeder 8 on substrate 6. In addition, in component mounting system 1, in a case where the replenishing operation of carrier tape 16 with respect to tape feeder 8 is detected, and carrier tape 16 replenished to tape feeder 8 is the (N+1)-th, the detected result is notified to the operator.

The operator can recognize that carrier tape 16 is excessively replenished to tape feeder 8 to which the number of carrier tapes 16 which are able to be supplied are already being supplied. With this, it is possible to prevent carrier tapes 16 which are more than the number of carrier tapes 16 which are able to be supplied to tape feeder 8 from being set in a state of being supplied to tape feeder 8.

A component supply method and a component mounting system of the present disclosure have an effect of preventing carrier tapes which are more than the number of carrier tapes which are able to be supplied to an automatic loading-type tape feeder from being set in a state of being supplied to the automatic loading-type tape feeder, and are useful in a component mounting field in which a component extracted from the tape feeder disposed in a component supplier is transported and mounted on a substrate.

What is claimed is:

1. A component supply method in a component mounting system which includes a component supply unit being capable of supplying up to N (N is a natural number equal to or larger than 1) carrier tapes for storing a component, and automatically transporting an inserted carrier tape, and a component mounting apparatus which mounts the component supplied from the component supply unit on a substrate, the method comprising:
   detecting a replenishing operation of a succeeding carrier tape with respect to the component supply unit;
   determining whether the succeeding carrier tape is an (N+1)-th that exceeds the number N of carrier tapes able to be supplied to the component supply unit; and
   in response to the succeeding carrier tape being the (N+1)-th, notifying an operator of a case where the succeeding carrier tape with which the component supply unit is to be replenished is the (N+1)-th.

2. The component supply method of claim 1,
   wherein it is determined that the succeeding carrier tape is the (N+1)-th based on a component ID of the succeeding carrier tape in which the replenishing operation of carrier tape is detected.

3. The component supply method of claim 1,
   wherein it is determined that the succeeding carrier tape in which the replenishing operation of carrier tape is detected is the (N+1)-th based on the number of component IDs included in component information of a carrier tape which is in a state of being supplied to the component supply unit in which the replenishing operation of carrier tape is detected.

4. The component supply method of claim 1,
   wherein in a case where the succeeding carrier tape in which the replenishing operation of carrier tape is detected is determined to be the (N+1)-th, an operation of updating component information of a carrier tape which is in a state of being supplied based on the component ID of the succeeding carrier tape in which the replenishing operation of carrier tape is detected, is not allowed.

5. The component supply method of claim 1,
wherein the component supply unit includes a shutter which prevents the succeeding carrier tape from being inserted into the component supply unit, and
wherein in a case where the succeeding carrier tape in which the replenishing operation of carrier tape is detected is determined to be the (N+1)-th, the shutter is set to be in a closed state.

6. The component supply method of claim 1,
wherein the component supply unit includes a sensor which detects the carrier tape inserted into the component supply unit, and
wherein the replenishing operation of carrier tape is detected based on a detection result of the sensor.

7. The component supply method of claim 1,
wherein component information of a carrier tape which is in a state of being supplied to the component supply unit is stored in a supply unit storage provided in the component supply unit.

8. The component supply method of claim 1,
wherein component information of a carrier tape in a state of being supplied to the component supply unit is stored in a system storage provided in the component mounting system.

9. The component supply method of claim 1, wherein the replenishing operation includes inserting one of the carrier tapes into the component supply unit and notifying the operator includes notifying the operator that the succeeding carrier tape with which the component supply unit is to be replenished is an excessive carrier tape which exceeds the number N of carrier tapes able to be supplied to the component supply unit.

* * * * *